United States Patent
Lee et al.

(10) Patent No.: US 8,828,863 B1
(45) Date of Patent: Sep. 9, 2014

(54) ELECTROLESS COPPER DEPOSITION WITH SUPPRESSOR

(71) Applicant: Lam Research Corporation, Fremont, CA (US)

(72) Inventors: William T. Lee, Dublin, CA (US); Xiaomin Bin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/926,932

(22) Filed: Jun. 25, 2013

(51) Int. Cl.
*H01L 21/67* (2006.01)
*H01L 21/768* (2006.01)
*H01L 21/285* (2006.01)

(52) U.S. Cl.
CPC .... *H01L 21/76834* (2013.01); *H01L 21/76874* (2013.01); *H01L 21/76865* (2013.01); *H01L 21/76871* (2013.01); *H01L 21/76873* (2013.01); *H01L 21/76843* (2013.01); *H01L 21/28562* (2013.01); *H01L 21/76841* (2013.01)
USPC ........... 438/627; 438/687; 438/269; 438/654; 438/678; 438/641; 257/E21.586

(58) Field of Classification Search
CPC ............... H01L 21/76834; H01L 21/76874; H01L 21/76865; H01L 21/76873; H01L 21/76843; H01L 21/76871; H01L 21/28562; H01L 2222/1084
USPC ......... 438/627, 687, 629, 654, 678, 641, 628; 257/E21.586

See application file for complete search history.

(56) References Cited

U.S. PATENT DOCUMENTS

| | | | |
|---|---|---|---|
| 6,342,447 B1 * | 1/2002 | Hoshino | 438/687 |
| 6,664,122 B1 | 12/2003 | Andryuschenko et al. | |
| 7,294,574 B2 | 11/2007 | Ding et al. | |
| 7,297,190 B1 | 11/2007 | Dordi et al. | |
| 7,456,102 B1 | 11/2008 | Varadarajan et al. | |
| 7,501,014 B2 | 3/2009 | Poole et al. | |
| 7,537,709 B2 | 5/2009 | Cooper et al. | |
| 7,651,934 B2 | 1/2010 | Lubomirsky et al. | |
| 7,659,197 B1 | 2/2010 | Juliano | |
| 7,682,966 B1 * | 3/2010 | Rozbicki et al. | 438/637 |
| 7,968,455 B2 * | 6/2011 | Lin et al. | 438/642 |
| 8,252,690 B2 | 8/2012 | Su et al. | |
| 2013/0203249 A1 * | 8/2013 | Nalla | 438/643 |
| 2013/0309863 A1 * | 11/2013 | Lin et al. | 438/653 |

* cited by examiner

*Primary Examiner* — Michael Trinh
(74) *Attorney, Agent, or Firm* — Beyer Law Group LLP

(57) ABSTRACT

A method for providing metal filled features in a layer is provided. A nonconformal metal seed layer is deposited on tops, sidewalls, and bottoms of the features, wherein more seed layer is deposited on tops and bottoms of features than sidewalls. The metal seed layer are etched back on tops, sidewalls, and bottoms of the features, wherein some metal seed layer remains on tops and bottoms of the features. Deposition on the seed layer on tops of the features is suppressed. An electroless "bottom up" deposition of metal is provided to fill the features.

19 Claims, 3 Drawing Sheets

ELECTROLESS COPPER DEPOSITION WITH SUPPRESSOR

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. Generally, features are etched into a layer and then filled with a conductor, such as copper. Methods of filling etched features with copper are described in U.S. Pat. No. 7,294,574, entitled "Sputter Deposition and Etching of Metallization Seed Layer for Overhang and Sidewall Improvement," by Ding et al., issued Nov. 13, 2007; U.S. Pat. No. 7,659,197, entitled "Selective Resputtering of Metal Seed Layers," by Juliano, issued Feb. 9, 2010; U.S. Pat. No. 6,664,122 entitled "Electroless Copper Deposition Method for Preparing Copper Seed Layers," by Andryuschenko et al., issued Dec. 16, 2003; U.S. Pat. No. 7,456,102, entitled "Electroless Copper Fill Process," by Varadarajan et al., issued Nov. 25, 2008; U.S. Pat. No. 7,501,014 entitled "Formaldehyde Free Electroless Copper Compositions," by Poole et al., issued Mar. 10, 2009; and U.S. Pat. No. 7,651,934, entitled "Process for Electroless Copper Deposition," by Lubomirsky et al., issued Jan. 26, 2010, which are all incorporated by reference for all purposes.

SUMMARY OF THE INVENTION

To achieve the foregoing and in accordance with the purpose of the present invention, a method for providing metal filled features in a layer is provided. A nonconformal metal seed layer is deposited on tops, sidewalls, and bottoms of the features, wherein more seed layer is deposited on tops and bottoms of features than sidewalls. The metal seed layer are etched back on tops, sidewalls, and bottoms of the features, wherein some metal seed layer remains on tops and bottoms of the features. Deposition on the seed layer on tops of the features is suppressed. An electroless "bottom up" deposition of metal is provided to fill the features.

In another manifestation of the invention, a method for providing metal filled features in a layer is provided. A barrier layer is deposited on tops, sidewalls, and bottoms of the features. A nonconformal copper or copper alloy seed layer is deposited over the barrier layer on tops, sidewalls, and bottoms of the features, wherein more seed layer is deposited on tops and bottoms of features than sidewalls. The metal seed layer is etched back on tops, sidewalls, and bottoms of the features, wherein some metal seed layer remains on tops and bottoms of the features. A suppressor layer of a polymer chain is formed only on the seed layer on tops of the features. An electroless "bottom up" deposition of copper or copper alloy is provided to fill the features.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various methods of filling features in dielectric layer with metal lines, vias, and contacts may cause voids. As feature size decreases, the likelihood and impact of the voids increases, thus making the avoidance of voids more difficult. An embodiment of the invention reduces voids caused while forming metal lines, vias, and contacts in features.

Figure 1:
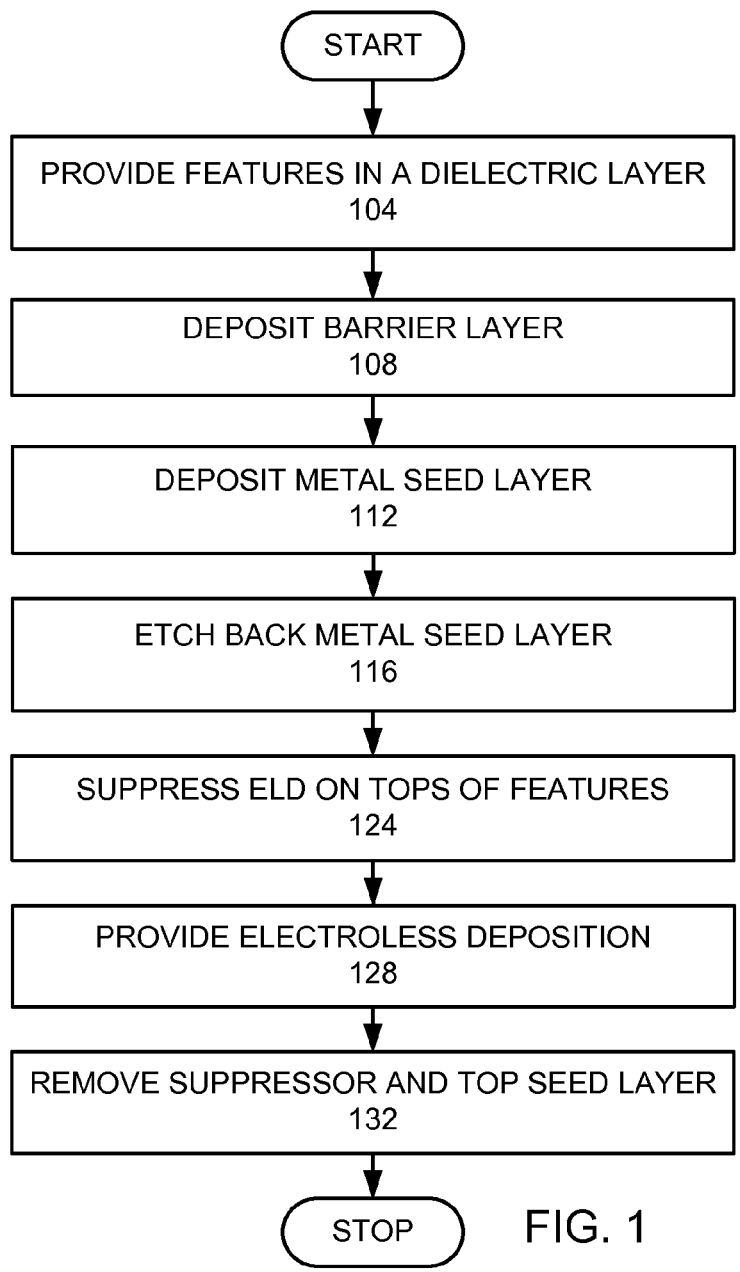
FIG. 1 is a flow chart of an embodiment of the invention.

FIG. 1 is a high level flow chart of an embodiment of the invention. In this embodiment, features are provided in a layer (step 104). A barrier layer is deposited over the surface of the layer (step 108). A metal seed layer is deposited over the surface of the layer (step 112). Preferably, the metal seed layer is deposited directionally and nonconformally, so that more of the metal seed layer is deposited on bottoms and tops of the features than on the sidewalls of the features. The metal seed layer is isotropically etched back (step 116). Electroless deposition on tops of the features is suppressed (step 124). An electroless deposition is used to deposit a metal such as cobalt or copper or other metal or alloys to fill the features with a conductive wiring or contact (step 128). A suppression layer and metal seed layer on top of the vias is removed (step 132).

Figure 2A:
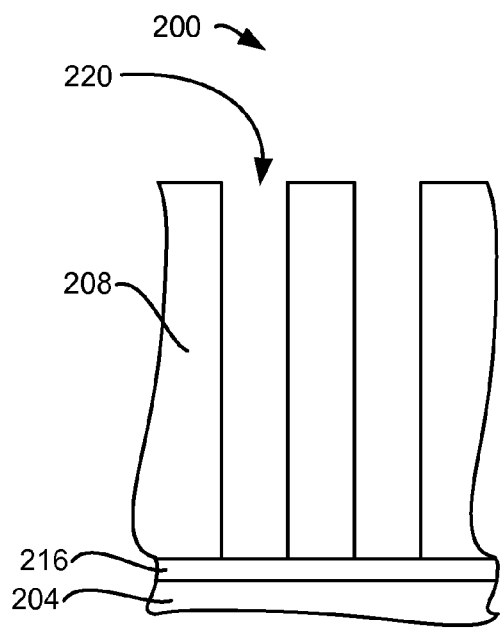
FIGS. 2A-H are schematic views of the formation of structures using the inventive process.

In a preferred embodiment of the invention, features are provided in a layer (step 104). FIG. 2A is a schematic cross-sectional view of a stack 200 with a substrate 204 and a layer 208 with features 220. In this example, one or more layers 216 are disposed between the substrate 204 and the layer 208. In this example the layer 208 with features 220 is a dielectric layer. More preferably, the layer 208 is a low-k dielectric layer, with a k value of less than 4.0. In this embodiment, the layer is organosilicate glass (OSG).

Figure 2B:
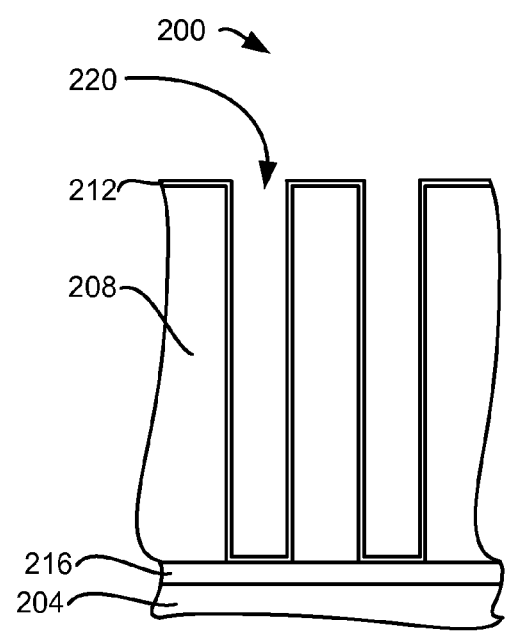

A barrier layer is deposited in the features (step 108). In this embodiment, the barrier layer comprises a Co, Ta, Ru, W, V or organic layer. In other embodiments, the barrier layer may comprise a metal nitride layer, such as TiN, RuN, VN, or TaN, or an amorphous carbon layer. FIG. 2B is a schematic cross-sectional view of the stack 200 after the barrier layer 212 has been deposited.

Figure 2C:
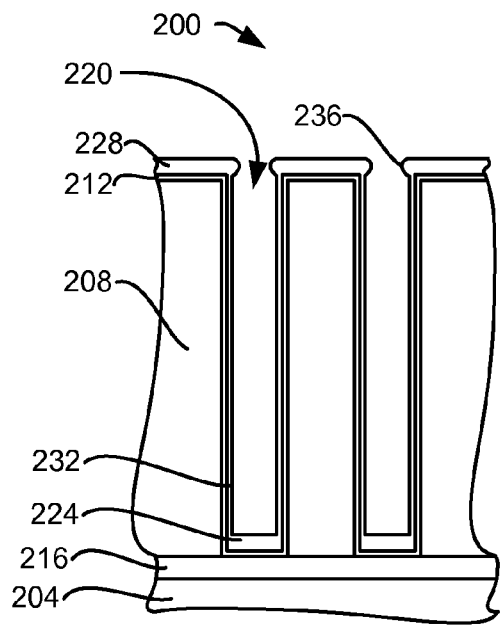

A metal seed layer is deposited with greater thickness on the tops and bottoms of the features with respect to the sidewalls of the features (step 112). In this embodiment, the metal seed layer is copper or a copper alloy, which is provided by a directional and non-conformal deposition, which is provided by a physical vapor deposition (PVD). FIG. 2C is a schematic view of the stack 200 after a copper seed layer is deposited preferentially on the tops and bottoms of the features with respect to the sidewalls of the features. As shown, there is greater deposition on the bottoms of the features 224, greater deposition on the tops of features 228, and little deposition on the sidewalls 232. As shown, on tops of the features 228 means on top of the layer 208 adjacent to the features 220. In this embodiment, overhangs 236 near the tops of the features 228 are also formed. The relative thicknesses of the depositions are not drawn to scale in order to be able to clearly illustrate the different layers. Preferably, the ratio of the thickness of the copper deposition on the bottoms of features 224 to the thickness of the copper deposition on the sidewalls 232 is at least 3:1. More preferably, the ratios of the thickness of the copper deposition on bottoms of features 224 to the thickness of the copper deposition on the sidewalls 232 are at least 5:1. A directional physical vapor deposition (PVD) is able to provide a non-conformal deposition with minimal deposition on the sidewalls 232 of the features. Such a directional PVD is known in the art. For example, a directional PVD is taught in U.S. Pat. No. 8,252,690, entitled, "In Situ Cu Seed Layer Formation for Improving Sidewall Coverage," to Su et al, issued Aug. 28, 2012, which is incorporated by reference for all purposes.

Figure 2D:
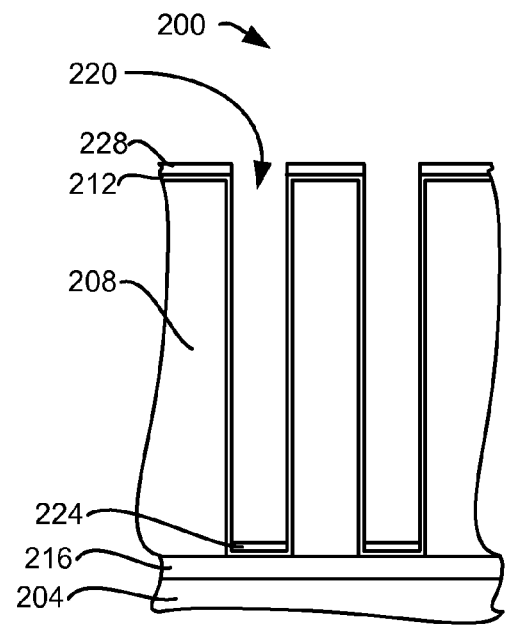

The metal seed layer is etched back (step 116). Preferably, the etch is a non-directional etch. Such a non-directional etch may be a wet or dry etch. The etch step should etch the seed but not the underlying barrier layer. Such a non-directional etch would etch the metal seed layer about equally on the tops, sidewalls, and bottoms of the features. Since there is much less deposition of the metal seed layer on the sidewalls, the metal seed layer on the sidewalls may be completely removed before the metal seed layers on tops and bottoms of the features. Preferably, the metal seed layer on the sidewalls is completely etched away, while the metal seed layer on tops and bottoms of the features remain. FIG. 2D is a schematic illustration of the stack 200 after the metal seed layer is etched back. The metal seed layer on the sidewalls is completely removed. The metal seed layer on the tops of the features 228 and the metal seed layer at the bottoms of the features 224 are etched, but still remain. The overhangs have also been removed. In an example of such an etch, the metal seed layer is exposed to a solution of $H_2O_2$, $NH_3$, and cyclohexanediaminetetraacetic acid (CDTA).

Figure 2E:
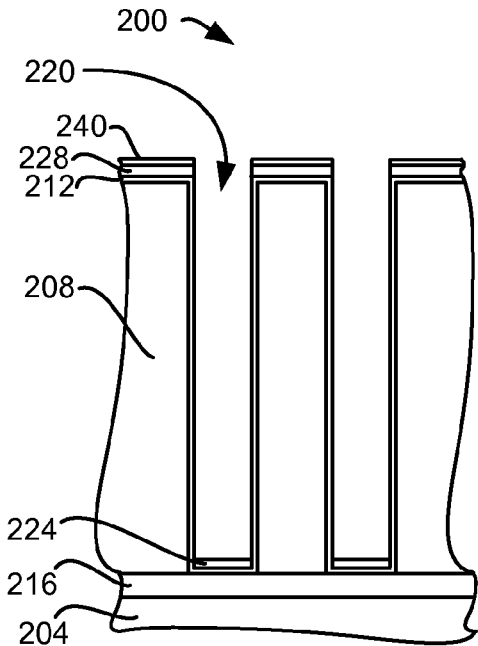

Electroless deposition on the tops of the features 228 is suppressed (step 124) without suppressing ELD on bottoms of the features 224. In this embodiment, a suppressor layer is formed from long polymer chains that are too large to deposit in the features. FIG. 2E is a schematic illustration of the stack 200 after suppressor layer 240 is formed over the metal seed layer at tops of the features 228. In this embodiment a suppressor layer is formed using suppressor molecules of polyethylene glycol (PEG). The specific PEG molecular weight will depend on the diameter or CD of the features 220. In this embodiment, the PEG molecule used is not able to fit within the features 220 since the PEG is larger than the diameter of the features. For features with a CD of 25 nm, it is preferred that the PEG molecules have a molecular weight of at least 6000.

Figure 2F:
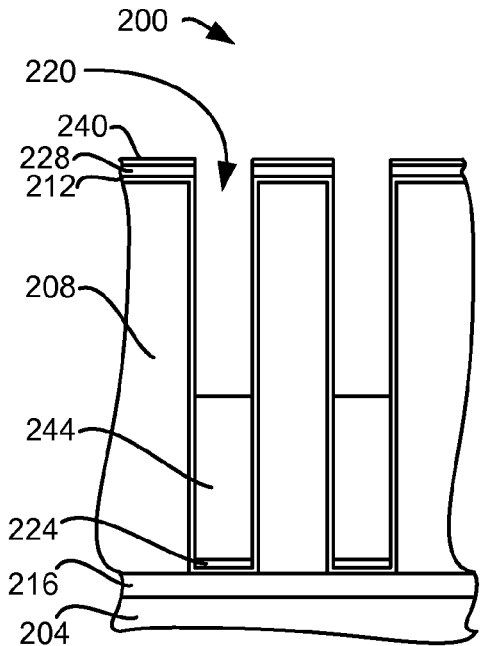
Figure 2G:
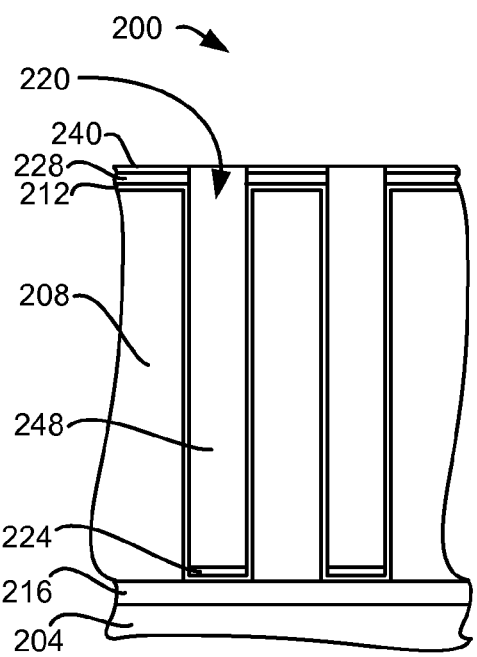

The stack 200 is then subjected to an electroless deposition (step 128). In this embodiment, the electroless deposition forms a copper or copper alloy line, via or contact in the features. FIG. 2F is a schematic illustration of a stack 200 partly through the electroless deposition forming parts of copper contacts 244. It should be noted that the contacts are first formed at the bottom of the features. FIG. 2G is a schematic illustration of a stack 200 after the electroless deposition is completed, where completed copper lines, vias or contacts 248 are formed in the features. In this embodiment, a bath is provided with a pH of 6.0, with a copper nitrate $(Cu(NO_3)_2$ concentration of 0.05 M, a cobalt nitrate (Co $(NO_3)_2)$ concentration of 0.15 M, and ethylenediamine concentration of 0.6M, a nitric acid $(HNO_3)$ concentration of 0.875 M, potassium bromide at a concentration of 3 mM, and bis(sodiumsulfopropyl) (SPS) at a concentration between about 0.000141 M and about 0.000282 M. Argon gas is used to deoxygenate the solution. Additional information regarding electroless copper deposition is in U.S. Pat. No. 7,297,190, entitled, Plating Solutions For Electroless Deposition of Copper, to Dordi et al., issued Nov. 20, 2007, which in incorporated by reference for all purposes. In other embodiments, formaldehyde or other organic reducing agents may be used in place of cobalt nitrate.

Figure 2H:
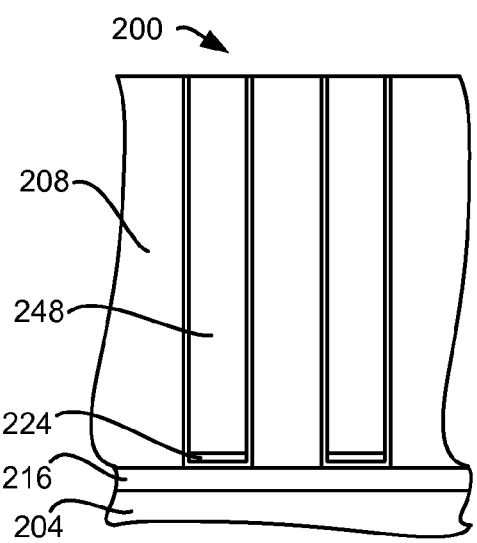

Additional processes may be used to further form the features. For example, an etch back or chemical mechanical polishing (CMP) may be used remove the suppressor layer 240, part of the seed layer on top of the features 228, parts of the barrier layer 212, and parts of the copper over the tops of the features (step 132). FIG. 2H is a schematic illustration of a stack after the stack 200 has been planarized using CMP.

In various embodiments, preferably the feature depth to feature width aspect ratio is at least 3:1. More preferably, the aspect ratio is at least 5:1. Most preferably, the aspect ratio is between 3:1 to 5:1. Preferably, the CD is less than 50 nm. More preferably, the CD is less than 30 nm. Most preferably, the CD is less than 20 nm. Different embodiments may be used to fill features that are lines, vias, or contacts.

The use of ELD instead of electroplating allows the removal of the sidewall metal seed layer. Embodiments of the invention take advantage of the fact that the PVD of the metal seed layer is non-conformal. Instead of trying to make the PVD process more conformal, which would increase defects as feature sizes scale down, embodiments use the inherent non-conformal deposition, to allow the removal of sidewall seed to provide an improved bottom-up fill deposition. An embodiment may provide the suppressor layer while filling the features.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing metal filled features in a layer, comprising:
   depositing a barrier layer on tops, sidewalls, and bottoms of the features;
   depositing a nonconformal copper or copper alloy seed layer over the barrier layer on tops, sidewalls, and bottoms of the features, wherein more seed layer is deposited on tops and bottoms of features than sidewalls;
   etching back the metal seed layer on tops, sidewalls, and bottoms of the features, wherein some metal seed layer remains on tops and bottoms of the features;
   forming a suppressor layer of a polymer chain only on the seed layer on tops of the features; and
   providing an electroless "bottom up" deposition of copper or copper alloy to fill the features.

2. A method for providing metal filled features in a layer, comprising:
   depositing a nonconformal metal seed layer on tops, sidewalls, and bottoms of the features, wherein more seed layer is deposited on tops and bottoms of features than sidewalls;
   etching back the metal seed layer on tops, sidewalls, and bottoms of the features, wherein some metal seed layer remains on tops and bottoms of the features;

suppressing deposition on the seed layer on tops of the features; and providing an electroless "bottom up" deposition of metal to fill the features.

3. The method, as recited in claim 2, further comprising depositing a barrier layer in the features, before depositing the metal seed layer.

4. The method, as recited in claim 3, wherein the etching back the metal seed layer comprises providing a wet etch.

5. The method, as recited in claim 4, wherein the depositing the metal seed layer deposits the metal seed layer on bottoms of the features with respect to sidewalls of the features at a thickness ratio of at least 3:1.

6. The method, as recited in claim 4, wherein the depositing the metal seed layer deposits metal seed layer on bottoms of the features with respect to sidewalls of the features at a thickness ratio of at least 5:1.

7. The method, as recited in claim 6, wherein at least one of the features has depth to width aspect ratio of at least 3:1.

8. The method, as recited in claim 7, wherein the features have a CD of less than 30 nm.

9. The method, as recited in claim 8, wherein the deposition of metal is a deposition of copper or copper alloy.

10. The method, as recited in claim 9, wherein the metal seed layer is a copper or copper alloy seed layer.

11. The method, as recited in claim 10, wherein the depositing the metal seed layer comprises providing a physical vapor deposition.

12. The method, as recited in claim 11, wherein the suppressing deposition on the seed layer on tops, comprises forming a suppressor layer on tops of the features.

13. The method, as recited in claim 12, wherein the suppressor layer is formed from polymer chains that are too large to deposit in the features.

14. The method, as recited in claim 13, wherein the polymer chains are formed by exposing the seed layer to polyethylene glycol.

15. The method, as recited in claim 2, wherein the depositing the metal seed layer deposits the metal seed layer on bottoms of the features with respect to sidewalls of the features at a thickness ratio of at least 3:1.

16. The method, as recited in claim 2, wherein at least one of the features has depth to width aspect ratio of at least 3:1.

17. The method, as recited in claim 2, wherein the suppressing deposition on the seed layer on tops, comprises forming a suppressor layer on tops of the features.

18. The method, as recited in claim 17, wherein the suppressor layer is formed from polymer chains that are too large to deposit in the features.

19. The method, as recited in claim 18, wherein the polymer chains are formed by exposing the seed layer to polyethylene glycol.

* * * * *